United States Patent
Rajasekhar

(10) Patent No.: US 12,422,461 B2
(45) Date of Patent: Sep. 23, 2025

(54) METHOD TO MEASURE HIGH VOLTAGES ACCURATELY

(71) Applicant: Analog Devices International Unlimited Company, Limerick (IE)

(72) Inventor: Sanjay Rajasekhar, Newbury (GB)

(73) Assignee: Analog Devices International Unlimited Company, Limerick (IE)

(*) Notice: Subject to any disclaimer, the term of this patent is extended or adjusted under 35 U.S.C. 154(b) by 180 days.

(21) Appl. No.: 18/481,646

(22) Filed: Oct. 5, 2023

(65) Prior Publication Data

US 2025/0116689 A1    Apr. 10, 2025

(51) Int. Cl.
  *G01R 19/257*    (2006.01)
  *G01R 15/04*     (2006.01)
  *G01R 19/25*     (2006.01)

(52) U.S. Cl.
  CPC .......... *G01R 19/257* (2013.01); *G01R 15/04* (2013.01); *G01R 19/2506* (2013.01)

(58) Field of Classification Search
  CPC ... G01R 19/257; G01R 15/04; G01R 19/2506
  See application file for complete search history.

(56) References Cited

U.S. PATENT DOCUMENTS

| | | | |
|---|---|---|---|
| 2015/0008901 A1* | 1/2015 | Mickelsen | G01R 1/30 324/120 |
| 2022/0082633 A1* | 3/2022 | Dhanjal | H02M 1/32 |
| 2022/0099712 A1* | 3/2022 | De Fazio | H02M 1/0009 |
| 2023/0288452 A1* | 9/2023 | Mahendra | G01R 31/31712 |

* cited by examiner

*Primary Examiner* — Roberto Velez

(74) *Attorney, Agent, or Firm* — Schwegman Lundberg & Woessner, P.A.

(57) ABSTRACT

A monitoring circuit includes a digital to analog converter (DAC) circuit; a reference circuit configured to produce multiple reference levels; a resistive divider circuit including a first terminal coupled to the output of the DAC circuit, a second terminal coupled to the reference circuit, and an output terminal to provide a measurement voltage; and a measurement circuit. The measurement circuit is configured to apply a first reference level to the second terminal of the resistive divider circuit and measure a first measurement voltage at the output terminal of the resistive divider circuit; apply a second reference level to the second terminal of the resistive divider circuit and measure a second measurement voltage at the output terminal of the resistive divider circuit; and calculate the DAC circuit output level using the first and second reference levels, and the first and second measurement voltages.

20 Claims, 3 Drawing Sheets

METHOD TO MEASURE HIGH VOLTAGES ACCURATELY

FIELD OF THE DISCLOSURE

This document pertains generally, but not by way of limitation, to electronic devices having a high output voltage, and more particularly, to circuits and methods of accurate measurement of the output voltage.

BACKGROUND

Amplifier systems can be used to provide a direct current (DC) output. In some applications, the system needs to produce a high voltage output that is highly accurate. These systems can be useful for example in optical switching control systems and in automatic test equipment (ATE). It is challenging for high output level systems to remain accurate due to errors that can occur with drift of the circuit elements over time.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
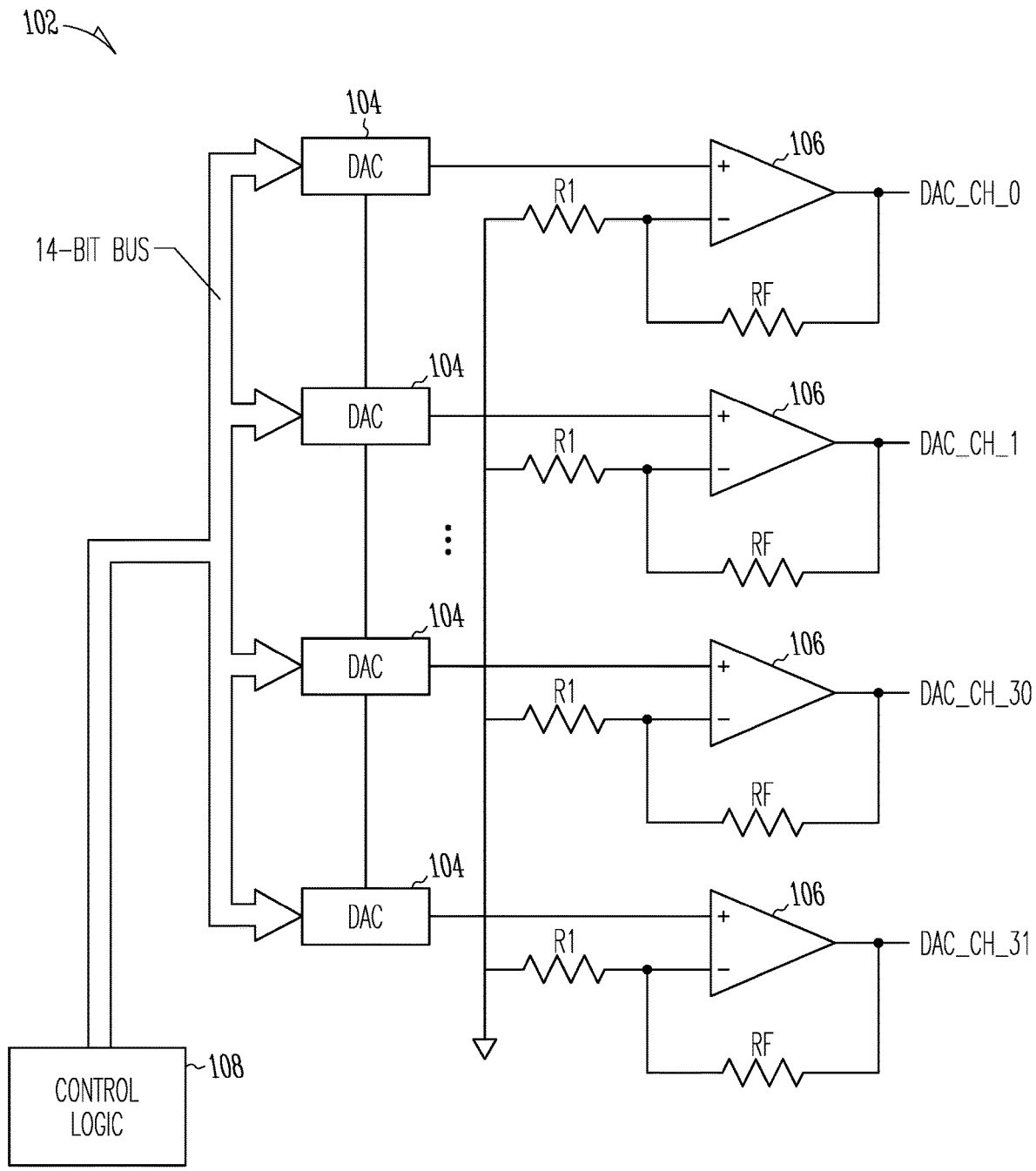
FIG. 1 is a block diagram of an example of a driver circuit having multiple digital to analog converter (DAC) channels.

FIG. 1 is a block diagram of an example of a driver circuit 102 having multiple digital to analog converter (DAC) channels. Each DAC channel includes a DAC circuit 104 and an amplifier 106. The DAC circuits 104 may be resistor string DAC circuits. The DAC circuits 104 in the example may be precision DAC circuits that convert a 14-bit digital value to an output level. The driver circuit 102 can include control logic circuitry 108 to input a 14-bit digital value to a DAC circuit 104 of a DAC channel. In certain examples, the output level is an output voltage level. In variations, the output level is an output current level. In the example of FIG. 1, the DAC channels are high output level DAC channels. For instance, the full-scale output level of the DAC channels may be 200 volts (200V).

In some applications, the driver circuit 102 may need to accurately monitor the high output levels of the DAC channels (e.g., ±20 millivolts, or ±20 mV). For a full-scale output voltage level of 200V, the Least Significant Bit (LSB) is $200/2^{14}$, or 12.2 mV. Due to noise, the worst-case step size can be two times the LSB, or approximately 25 mV. The worst-case error for a target output setting is one-half the worst-case step size or ±12.5 mV, which is the resolution of 14-bit DAC with a 200V full scale output. For an accuracy of ±20 mV, ±12.5 mV of this is lost in the resolution of the DAC, leaving ±7.5 mV as the budget for all errors that can occur, such as drift errors of the components on the DAC channel for example. A challenge is that the output of a high output driver is typically divided down to the voltage range of the monitoring circuits. This can result in trying to monitor very small voltages using the monitor circuits. For example, to monitor the full-scale output of 200V DAC channel using circuits of a 5V process, the output voltage may be divided down 40 times and then measured with an analog-to-digital converter (ADC). Dividing down the ±7.5 mV error budget results in needing to monitor a ±150 microvolt (150 uV) accuracy in the monitoring circuit, which can be very challenging as the dividing circuitry, the monitoring ADC, and signal conditioning circuits may have drift errors, offset errors, gain errors, etc.

Figure 2:
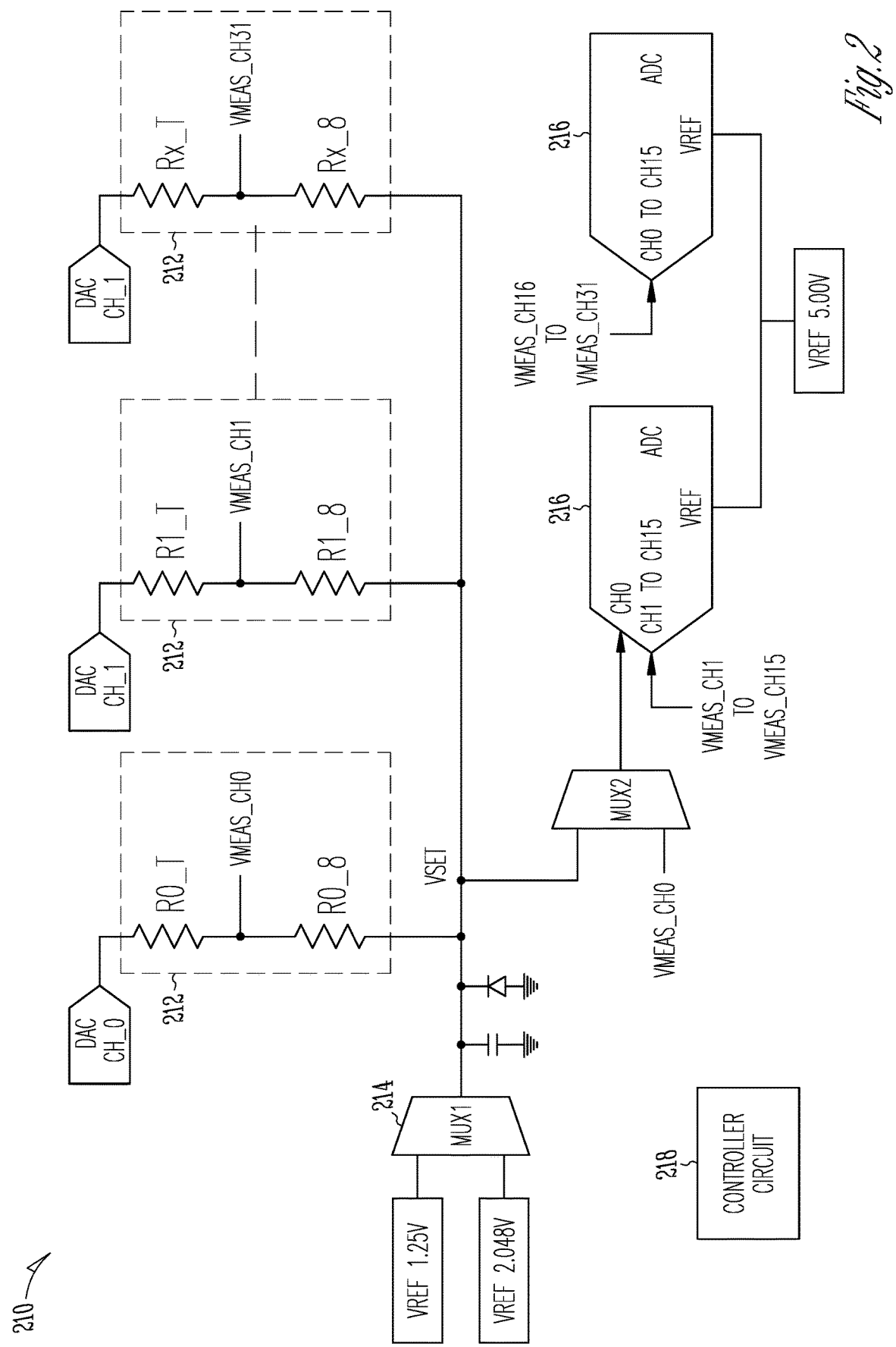
FIG. 2 is a circuit diagram of an example of a monitoring circuit to monitor the output of high output level DAC channels.

FIG. 2 is a circuit diagram of an example of a monitoring circuit 210 to monitor the output of high output level DAC channels (e.g., the DAC channels of the driver circuit 102 of FIG. 1). The monitoring circuit 210 includes a voltage divider circuit 212 connected to the output of each DAC channel to be monitored. In the example of FIG. 2, there are 32 DAC channels numbered 0 to 31 (CH-0 to CH_31), and the voltage divider circuits 212 are resistive divider circuits.

The resistive divider circuits include a top resistor (Rx_T) and a bottom resistor (Rx_B). The top terminal of each resistive divider circuit is connected to the output of one of the DAC channels, and the bottom terminals of the resistive divider circuits are connected to a circuit node labeled VSET. The difference between the DAC channel output level and output level of VSET is divided by the resistive divider circuits. The voltage of the output terminal (VMEAS_CHx) between the top resistor and the bottom resistor is measured to monitor the output levels of the DAC channels. The voltage VSET is selectable by a multiplexer circuit 214. Multiplexer circuit 214 is used to select a voltage reference (VREF) for VSET.

The monitoring circuit 210 includes a measurement circuit that includes one or more analog-to-digital converter (ADC) circuits 216 and a controller circuit 218. In the example of FIG. 2, two multi-channel ADC circuits 216 are used to measure the voltage of the output terminals of the resistive divider circuits. In certain examples, the monitoring circuit 210 can include a dedicated ADC for each DAC channel. In variations, the monitoring circuit 210 can include one ADC circuit and the outputs of the DAC channels are multiplexed onto the ADC circuit for measurement.

The controller circuit 218 includes logic circuitry to perform the functions described. For instance, the controller circuit 218 may include a microprocessor, application specific integrated circuit (ASIC), or programmable gate array (PGA). The controller circuit 218 controls the circuit elements of the monitoring circuit 210 to perform measurements of the DAC channel outputs and to adjust a DAC code of the DAC circuit of one or more of the DAC channels if the DAC channel output varies from the target output.

Figure 3:
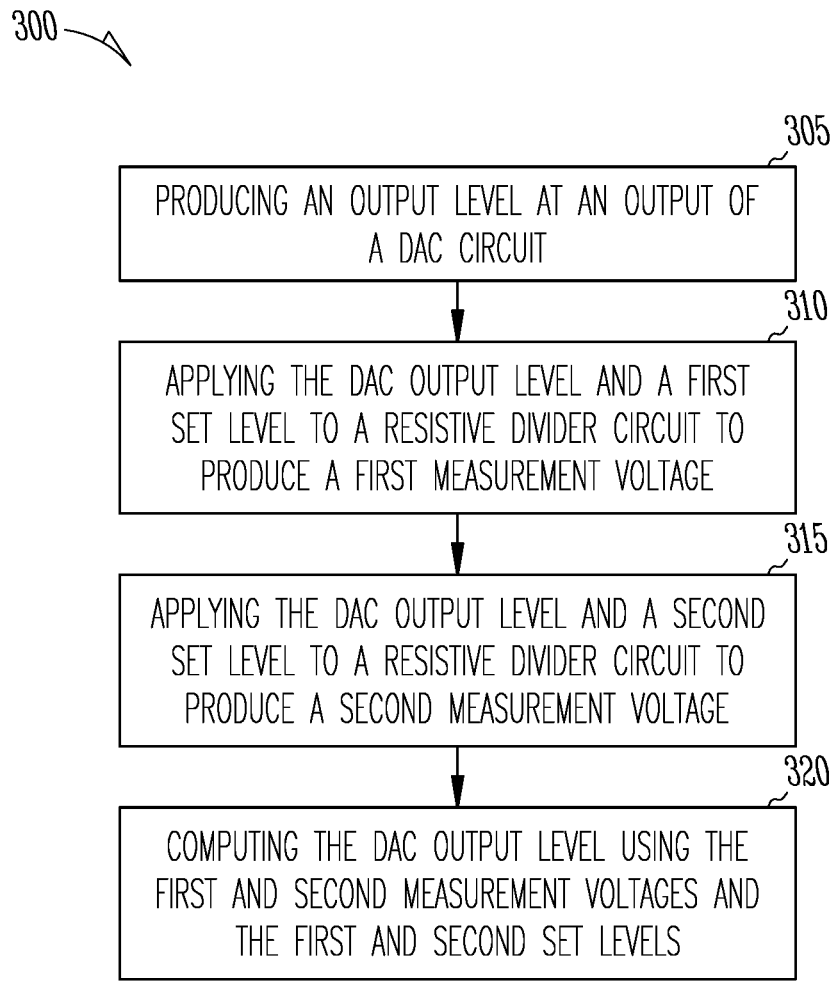
FIG. 3 is a flow diagram of an example of a method of operating a monitoring circuit.

FIG. 3 is a flow diagram of an example of a method 300 of operating a monitoring circuit (e.g., the monitoring circuit 210 of FIG. 2) to monitor the output of a circuit (e.g., the driver circuit 102 of FIG. 1) having a high output level, such as a high output voltage or high output current.

At block 305, a DAC output level is produced at an output of a DAC circuit of a DAC channel. The DAC output level can be a high voltage output level. For instance, the full scale of the DAC channel may be 200V and the output of the DAC channel can be in the range of one LSB of the DAC circuit to the full scale of the DAC circuit. The monitoring circuit includes a measuring circuit that can include a controller circuit (e.g., controller circuit 218 in FIG. 2) and at least one ADC circuit (e.g., the ADC circuit 216 of FIG. 2). The output level of the DAC channel is applied to a resistive divider circuit. The controller circuit sets the circuit node at the bottom terminal of the resistive divider circuit to a first set level. In the example of FIG. 2, the controller circuit 218 sets the voltage VSET of the bottom terminal to the reference voltage of 1.25V.

At block 310, the DAC output level and the first set level are applied to the resistive divider circuit to produce a first measurement voltage at the output terminal of the resistive divider circuit. The controller circuit may initiate the measurement by the ADC circuit. If there are multiple DAC channels as in the example of FIG. 2, the controller circuit may measure the first measurement voltage for all the DAC channels using the ADC circuit or circuits. The first measurement voltage for a DAC channel ($V_{MEAS\_CHx\_v1}$) is $$V_{MEAS\_CHx\_v1} = (V_{DAC\_OUT\_CHx} - V_{SET\_1})\left(\frac{R_{x\_B}}{R_{x\_T} + R_{x\_B}}\right) + V_{SET\_1}. \quad (1)$$

where $V_{DAC\_OUT\_CHx}$ is the output level of the DAC channel, $V_{SET\_1}$ is the first set level, $R_{x\_B}$ is the bottom resistance of the resistive divider, and $R_{x\_T}$ is the top resistance of the resistive divider. In the example of FIG. 2, the controller circuit 218 may use multiplexer circuit 220 to measure the $V_{SET\_1}$ reference using the ADC circuit 216.

At block 315, the controller circuit sets the circuit node at the bottom terminal of the resistive divider circuit to the second set level, and the DAC output level and the first set level are applied to the resistive divider circuit to produce a second measurement voltage at the output terminal of the resistive divider circuit. In the example of FIG. 2, the controller circuit 218 sets the voltage VSET to the reference voltage of 2.048V. Again, if there are multiple DAC channels, the controller circuit may measure the second measurement voltage for all the DAC channels using the ADC circuit or circuits. In variations, the controller circuit measures both the first and second measurement voltages for one DAC channel before proceeding to measure the voltages for the next DAC channel. The second measurement voltage for a DAC channel ($V_{MEAS\_CHx\_v2}$) is $$V_{MEAS\_CHx\_v2} = (V_{DAC\_OUT\_CHx} - V_{SET\_2})\left(\frac{R_{x\_B}}{R_{x\_T} + R_{x\_B}}\right) + V_{SET\_2}. \quad (2)$$

where $V_{DAC\_OUT\_CHx}$ is the output level of the DAC channel, and $V_{SET\_2}$ is the second set level. In the example of FIG. 2, the controller circuit 218 may use multiplexer circuit 220 to measure the $V_{SET\_2}$ reference using the ADC circuit 216.

There are two unknowns in Equation (1) and Equation (2); the value of the DAC channel output level ($V_{DAC\_OUT\_CHx}$) and the attenuation ratio (k) of the resistive divider, which is $$k = \frac{R_{x\_B}}{R_{x\_T} + R_{x\_B}}. \quad (3)$$

Solving for the difference in the first and second measurement voltages using equations (1)-(3) yields $$V_{MEAS\_CHx\_v1} - V_{MEAS\_CHx\_v2} = (V_{SET\_1} - V_{SET\_2})(1 - k). \quad (4)$$

From Equation (4), the attenuation ratio k can be expressed as $$k = 1 - \left(\frac{V_{MEAS\_CHx\_1} - V_{MEAS\_CHx\_2}}{V_{SET\_1} - V_{SET\_2}}\right). \quad (5)$$

Equation (5) above shows that the attenuation ratio k can be calculated from the voltages measured by the ADC circuit, and the resistance values of the top and bottom resistances of the resistive divider circuit are not used to calculate the attenuation ratio k.

At block 320, the controller circuit computes the DAC channel output level using the measured voltages and the attenuation ratio k. For instance, the DAC channel output level can be calculated as $$V_{DAC\_OUT\_CHx} = V_{SET\_1} + k(V_{MEAS\_CHx\_1} - V_{SET\_1}). \quad (6)$$

If the reference for $V_{SET\_1}$ is measured using the ADC, the calculation in Equation (6) will result in the correct value of the DAC channel output level ($V_{DAC\_OUT\_CHx}$) despite any drift in the resistances or the reference voltages. The method 300 of FIG. 3 results in an accurate measurement of output of a DAC Channel that is not affected by leakage currents of switches or drift errors of the references because these errors cancel out in the approach outlined above.

The controller circuit can use the computed value of the DAC channel output level to adjust the DAC channel to a target output level, such as by adjusting the DAC code of the DAC circuit of the channel to bring the output level to within an LSB of the target output level. If there are multiple DAC channels, the monitoring circuit can compute the DAC output level of each channel, and individually adjust the DAC circuit of each channel to move the output level to toward the target. The monitoring circuit may measure and adjust the DAC channel outputs according to a schedule over the life of the high voltage circuit that includes the DAC channels. The monitoring circuit may measure and adjust one channel at a time or measure and adjust all the channels in parallel.

System and methods have been described for monitoring high output and high-resolution DAC channels accurately. The monitoring and control of the DAC circuits is accurate despite offset errors, gain errors, and noise level errors that drift over time. Although examples have been provided with DAC channels that output high voltage levels, the approaches described herein can be applied to DAC channels that output a high current level with high-resolution.

ADDITIONAL DESCRIPTION AND EXAMPLES

Example 1 includes subject matter (such as a monitoring circuit) comprising a digital to analog converter (DAC) circuit to produce a DAC output level at an output of the DAC circuit, a resistive divider circuit including a first terminal coupled to the output of the DAC circuit, a second terminal coupled to the reference circuit, and an output terminal to provide a measurement voltage, and a measurement circuit. The measurement circuit is configured to apply a first reference level to the second terminal of the resistive divider circuit and measure a first measurement voltage at the output terminal of the resistive divider circuit, apply a second reference level to the second terminal of the resistive divider circuit and measure a second measurement voltage at the output terminal of the resistive divider circuit, and calculate the DAC output level using the first and second reference levels, and the first and second measurement voltages.

In Example 2, the subject matter of Example 1 optionally includes the measurement circuit configured to adjust a DAC code of the DAC circuit according to the calculated DAC output level to set the DAC output level to a target output level.

In Example 3, the subject matter of one or both of Examples 1 and 2 optionally includes the measurement circuit including at least one analog to digital (ADC) circuit configured to produce digital values for the first reference level, the first measurement voltage, the second reference level, and the second measurement voltage.

In Example 4, the subject matter of Example 3 optionally includes a multiplexer circuit configured to apply either of a reference level or a measurement voltage to the at least one ADC circuit.

In Example 5, the subject matter of one or both of Examples 3 and 4 optionally includes the measurement configured to calculate an attenuation ratio of the resistive divider circuit using the digital values of the first reference level, the first measurement voltage, the second reference level, and the second measurement voltage, and not using a resistance value of the resistive divider circuit, and calculate the DAC output level using the attenuation ratio.

In Example 6, the subject matter of one or any combination of Examples 1-5 optionally includes the DAC circuit configured to produce a DAC output level of fifty volts (50V) or greater.

In Example 7, the subject matter of one or nay combination of Examples 1-5 optionally includes a fourteen-bit DAC circuit configured to produce a full-scale DAC output voltage of two hundred volts (200V) or greater.

In Example 8, the subject matter of one or any combination of Examples 1-7 optionally includes multiple DAC channels and multiple resistive divider circuits, and each resistive divider circuit includes a first terminal coupled to a DAC channel of the multiple DAC channels. The measurement circuit is optionally configured to apply the first and second reference levels to second terminals of the resistive divider circuits, produce first and second measurement voltages at third terminals of the resistive divider circuits, and calculate DAC output levels for the multiple DAC channels.

Example 9, includes subject matter (such as a method of operating a monitoring circuit) or can optionally be combined with one or any combination of Examples 1-8 to include such subject matter, comprising producing a digital to analog converter (DAC) output level at an output of a DAC circuit, applying, by the monitoring circuit, the DAC output level and a first set level to a resistive divider circuit to produce a first measurement voltage, applying the DAC output level and a second set level to the resistive divider circuit to produce a second measurement voltage, and computing the DAC output level using the first and second measurement voltages and the first and second set levels.

In Example 10, the subject matter of Example 9 optionally includes the monitoring circuit adjusting a DAC code of the DAC circuit using a controller according to the calculated DAC output level.

In Example 11, the subject matter of one or both of Examples 9 and 10 optionally includes the monitoring circuit adjusting regulating the DAC output level to a target output voltage using a controller according to the calculated DAC output level.

In Example 12, the subject matter of one or any combination of Examples 9-11 optionally includes measuring the first measurement voltage and the second measurement voltage using at least one analog to digital converter (ADC) circuit.

In Example 13, the subject matter of one or any combination of Examples 9-12 optionally includes measuring the first set level and the second set level using at least one ADC circuit.

In Example 14, the subject matter of one or any combination of Examples 9-13 optionally includes producing an output voltage of fifty volts (50V) or greater at the output of the DAC circuit.

In Example 15, the subject matter of one or any combination of Examples 9-13 optionally includes producing a DAC output voltage of two hundred volts (200V) or greater using a DAC circuit having fourteen bits.

In Example 16 the subject matter of one or any combination of Examples 9-15 optionally includes computing an output voltage of the DAC circuit using first and second measurement voltages, first and second set voltages, and not using a resistance value of the resistive divider circuit to compute the output voltage.

Example 17 includes subject matter such as a driver circuit comprising multiple digital to analog converter (DAC) channels, a reference circuit configured to provide multiple reference voltages, multiple voltage divider circuits, and a measurement circuit. Each DAC channel includes a DAC circuit having a DAC output. Each voltage divider circuit is coupled to the reference circuit and a respective DAC channel of the multiple DAC channels, and includes an output terminal to produce a measurement voltage for the DAC output of the respective DAC channel. The measurement circuit includes at least one multi-channel analog to digital converter (ADC) circuit and a controller. The controller is configured to set the output of the reference circuit to a first reference voltage to produce first measurement voltages by the multiple voltage divider circuits and measure the first measurement voltages using the multi-channel ADC, set the output of the reference circuit to a second reference voltage to produce second measurement voltages and measure the second measurement voltages using the multi-channel ADC, calculate DAC output voltages of the multiple DAC channels using the first and second measurement voltages, and the first and second reference voltages, and adjust DAC codes of the multiple DAC channels according to the calculated DAC output voltages.

In Example 18, the subject matter of Example 17 optionally includes the multi-channel ADC circuit configured to measure the first and second reference voltages and the controller is configured to calculate the DAC output voltages using the first and second reference voltages measured by the multi-channel ADC circuit.

In Example 19, the subject matter of one or both of Examples 17 and 18 optionally includes the DAC channels including a fourteen-bit DAC circuit having a full-scale output voltage of fifty volts (50V) or more.

In Example 20, the subject matter of one or any combination of Examples 17-19 optionally includes a multiplexer circuit to apply a reference voltage of the multiple reference voltages to the multiple voltage divider circuits.

These non-limiting examples can be combined in any permutation or combination. The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects. Method examples described herein can be machine or computer-implemented at least in part.

What is claimed is:

1. A monitoring circuit comprising:
    a digital to analog converter (DAC) circuit to produce a DAC output level at an output of the DAC circuit;
    a reference circuit configured to produce multiple reference levels;
    a resistive divider circuit including a first terminal coupled to the output of the DAC circuit, a second terminal coupled to the reference circuit, and an output terminal to provide a measurement voltage; and
    a measurement circuit configured to:
        apply a first reference level to the second terminal of the resistive divider circuit and measure a first measurement voltage at the output terminal of the resistive divider circuit;
        apply a second reference level to the second terminal of the resistive divider circuit and measure a second measurement voltage at the output terminal of the resistive divider circuit; and
        calculate the DAC output level using the first and second reference levels, and the first and second measurement voltages.

2. The monitoring circuit of claim 1, wherein the measurement circuit is configured to adjust a DAC code of the DAC circuit according to the calculated DAC output level to set the DAC output level to a target output level.

3. The monitoring circuit of claim 1, wherein the measurement circuit includes at least one analog to digital (ADC) circuit configured to produce digital values for the first reference level, the first measurement voltage, the second reference level, and the second measurement voltage.

4. The monitoring circuit of claim 3, including a multiplexer circuit configured to apply either of a reference level or a measurement voltage to the at least one ADC circuit.

5. The monitoring circuit of claim 3, wherein the measurement circuit is configured to:
    calculate an attenuation ratio of the resistive divider circuit using the digital values of the first reference level, the first measurement voltage, the second reference level, and the second measurement voltage, and not using a resistance value of the resistive divider circuit; and
    calculate the DAC output level using the attenuation ratio.

6. The monitoring circuit of claim 1, wherein the DAC circuit is configured to produce a DAC output level of fifty volts (50V) or greater.

7. The monitoring circuit of claim 1, wherein the DAC circuit is a fourteen-bit DAC circuit configured to produce a full-scale DAC output voltage of two hundred volts (200V) or greater.

8. The monitoring circuit of claim 1,
    wherein the DAC circuit is a first DAC circuit included in a first DAC channel of multiple DAC channels;
    wherein the resistive divider circuit is a first resistive divider circuit of multiple resistive divider circuits, wherein each resistive divider circuit includes a first terminal coupled to a DAC channel of the multiple DAC channels; and
    wherein the measurement circuit is configured to:
        apply the first and second reference levels to second terminals of the resistive divider circuits;
        produce first and second measurement voltages at third terminals of the resistive divider circuits; and
        calculate DAC output levels for the multiple DAC channels.

9. A method of operating a monitoring circuit to monitor a high voltage circuit output, the method comprising:
    producing a digital to analog converter (DAC) output level at an output of a DAC circuit;
    applying, by the monitoring circuit, the DAC output level and a first set level to a resistive divider circuit to produce a first measurement voltage;
    applying the DAC output level and a second set level to the resistive divider circuit to produce a second measurement voltage; and
    computing the DAC output level using the first and second measurement voltages and the first and second set levels.

10. The method of claim 9, including the monitoring circuit adjusting a DAC code of the DAC circuit using a controller according to the calculated DAC output level.

11. The method of claim 9, including the monitoring circuit adjusting regulating the DAC output level to a target output voltage using a controller according to the calculated DAC output level.

12. The method of claim 9, including measuring the first measurement voltage and the second measurement voltage using at least one analog to digital converter (ADC) circuit.

13. The method of claim 9, including measuring the first set level and the second set level using at least one analog to digital converter (ADC) circuit.

14. The method of claim 9, wherein the producing the DAC output level at the output of the DAC circuit includes producing an output voltage of fifty volts (50V) or greater at the output of the DAC circuit.

15. The method of claim 9, wherein the producing the DAC output level at the output of the DAC circuit includes producing a DAC output voltage of two hundred volts (200V) or greater using a DAC circuit having fourteen bits.

16. The method of claim 9, wherein the first and second set levels are first and second set voltages, and wherein the computing the DAC output level includes computing an output voltage of the DAC circuit using the first and second measurement voltages, the first and second set voltages, and not using a resistance value of the resistive divider circuit to compute the output voltage.

17. A driver circuit comprising:
   multiple digital to analog converter (DAC) channels, each DAC channel including a DAC circuit having a DAC output;
   a reference circuit configured to provide multiple reference voltages;
   multiple voltage divider circuits, each voltage divider circuit coupled to the reference circuit and a respective DAC channel of the multiple DAC channels, and including an output terminal to produce a measurement voltage for the DAC output of the respective DAC channel; and
   a measurement circuit including:
   at least one multi-channel analog to digital converter (ADC) circuit; and
   a controller configured to:
      set the output of the reference circuit to a first reference voltage to produce first measurement voltages by the multiple voltage divider circuits and measure the first measurement voltages using the multi-channel ADC;
      set the output of the reference circuit to a second reference voltage to produce second measurement voltages and measure the second measurement voltages using the multi-channel ADC;
      calculate DAC output voltages of the multiple DAC channels using the first and second measurement voltages, and the first and second reference voltages; and
      adjust DAC codes of the multiple DAC channels according to the calculated DAC output voltages.

18. The driver circuit of claim 17, wherein the multi-channel ADC circuit is configured to measure the first and second reference voltages and the controller is configured to calculate the DAC output voltages using the first and second reference voltages measured by the multi-channel ADC circuit.

19. The driver circuit of claim 17, wherein each DAC channel includes a fourteen-bit DAC circuit having a full-scale output voltage of fifty volts (50V) or more.

20. The driver circuit of claim 17, wherein the reference circuit includes a multiplexer circuit to apply a reference voltage of the multiple reference voltages to the multiple voltage divider circuits.

* * * * *